United States Patent
Ardeishar et al.

(10) Patent No.: US 8,972,914 B2
(45) Date of Patent: Mar. 3, 2015

(54) COEXISTENCE OF MULTIPLE VERIFICATION COMPONENT TYPES IN A HARDWARE VERIFICATION FRAMEWORK

(71) Applicant: Mentor Graphics Corporation, Wilsonville, OR (US)

(72) Inventors: Raghu Ardeishar, McLean, VA (US); Richard Edelman, San Jose, CA (US); Avidan Efody, Rosh Haayin (IL); Allan Crone Klinck, Stockholm (SE)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/148,265

(22) Filed: Jan. 6, 2014

(65) Prior Publication Data

US 2014/0123087 A1 May 1, 2014

Related U.S. Application Data

(63) Continuation of application No. 13/761,074, filed on Feb. 6, 2013, now abandoned, which is a continuation of application No. 13/478,984, filed on May 23, 2012, now abandoned, which is a continuation of application No. 12/763,163, filed on Apr. 19, 2010, now abandoned.

(60) Provisional application No. 61/170,588, filed on Apr. 17, 2009.

(51) Int. Cl.
*G06F 9/455* (2006.01)
*G06F 17/50* (2006.01)
*G06F 11/22* (2006.01)

(52) U.S. Cl.
CPC ........ *G06F 17/5045* (2013.01); *G06F 17/5022* (2013.01)
USPC .......................................... 716/106; 716/136

(58) Field of Classification Search
USPC .................................................. 716/106, 136
See application file for complete search history.

(56) References Cited

U.S. PATENT DOCUMENTS

| | | | | |
|---|---|---|---|---|
| 6,856,950 | B1 * | 2/2005 | Abts et al. | 703/13 |
| 8,397,188 | B1 * | 3/2013 | Scheidt | 716/106 |
| 2006/0259879 | A1 * | 11/2006 | Chetput et al. | 716/2 |
| 2006/0271904 | A1 * | 11/2006 | Emerson et al. | 716/18 |
| 2009/0164193 | A1 * | 6/2009 | McMillan | 703/13 |
| 2010/0241414 | A1 * | 9/2010 | Yeh et al. | 703/14 |
| 2011/0184713 | A1 * | 7/2011 | Yang | 703/13 |

\* cited by examiner

*Primary Examiner* — Suresh Memula

(57) ABSTRACT

Coexistence of multiple types of verification components in a single verification framework is provided. Particularly, the coexistence of proprietary e verification components in an open verification methodology framework is provided.

20 Claims, 6 Drawing Sheets

COEXISTENCE OF MULTIPLE VERIFICATION COMPONENT TYPES IN A HARDWARE VERIFICATION FRAMEWORK

RELATED APPLICATIONS

This application is a continuation of U.S. patent application Ser. No. 13/761,074, entitled "Coexistence Of Multiple Verification Component Types In A Hardware Verification Framework," filed Feb. 6, 2013, which is a continuation of U.S. patent application Ser. No. 13/478,984, entitled "Coexistence Of Multiple Verification Component Types In A Hardware Verification Framework," filed May 23, 2012, now abandoned, which is a continuation of U.S. patent application Ser. No. 12/763,163, entitled "Coexistence of Multiple Verification Component types in a Hardware Verification Framework," filed Apr. 19, 2010, now abandoned, which claims the benefit of U.S. Provisional Patent Application No. 61/170,588, entitled "Reusing eVC by Co-Existence," naming Allan Klinck et al. as inventors, and filed Apr. 17, 2009, all of which are incorporated entirely herein by reference.

FIELD OF THE INVENTION

The invention relates to the field of electronic device design and verification. More specifically, various implementations of the invention relate to facilitating the coexistence of multiple types of verification components within the same verification framework.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, often mathematically, to confirm that the circuit described by the device design will correctly perform the desired functions. This analysis is sometimes referred to as "formal verification." Additionally, timing verifications are often made at this stage, by for example simulating the various clocks employed to drive the device.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools) are commonly used for both of these tasks.

As indicated, device verification often takes place prior to the actual manufacturing of the device. As a result, hardware description languages are typically employed to model the hardware and act as an embodiment for testing purposes. Additionally, hardware verification languages are often used to provide a stimulus with which to test the hardware design. More particularly, a hardware verification languages may be employed to generate a sequences (or typically many sequences) of inputs to be applied to the hardware designs. To facilitate generation of test sequences, hardware verification languages usually have a number of test sequence generation routines, such as, for example, a constrained random generation routine.

In order to facilitate reuse of hardware components between designs and to assist in the verification of proprietary hardware components, such as, for example, a proprietary integrated circuit, vendors and manufactures will typically provide a verification component for selected portion of a design or for selected reusable hardware components. A verification component allows for the seamless integration of the selected hardware component into the verification environment.

As those of skill in the art can appreciate, legacy hardware verification languages, such as, for example, the e verification language, were typically proprietary in nature. Accordingly, verification components compatible with these proprietary hardware verification languages are not compatible with the modern open verification methodologies ("OVM") in use today. As a result, reusing legacy verification components in modern OVM based verification is difficult.

SUMMARY OF THE INVENTION

The invention provides for the coexistence of multiple types of verification components in a verification framework. In various implementations of the invention, a wrapper for the legacy verification component and an interface reflection for the legacy verification component is generated. Subsequently, the legacy verification component is wrapped in the generated wrapper and the wrapped legacy verification component is then instantiated into the verification framework. In various implementations, the wrapper extends the legacy verification routine to include functionality not present in the legacy verification framework. The interface reflection provides for the reflection of data between the legacy verification component and the verification framework.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE EMBODIMENTS

Although the operations of the disclosed implementations may be described herein in a particular sequential order, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods. Additionally, the detailed description sometimes uses terms like "determine" to describe the disclosed methods. Such terms are often high-level abstractions of the actual operations that are performed. The actual operations that correspond to these terms can vary and may depend upon the particular implementation.

Some of the methods described herein can be implemented by software stored on a computer readable storage medium, or executed on a computer. Additionally, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Illustrative Computing Environment

Figure 1:
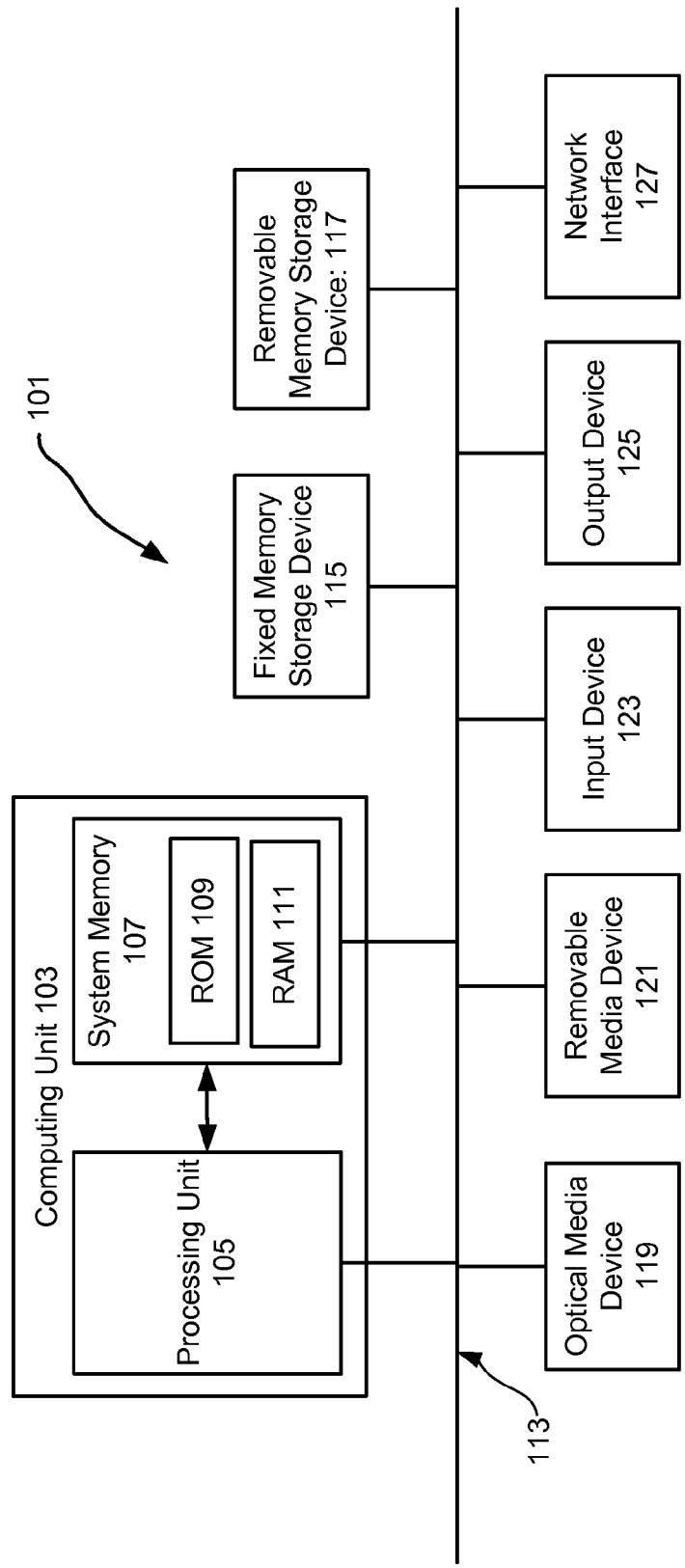
FIG. 1 shows an illustrative computing environment.

As the techniques of the present invention may be implemented using software instructions, the components and operation of a generic programmable computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices; such as a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Hardware Verification

Figure 2:
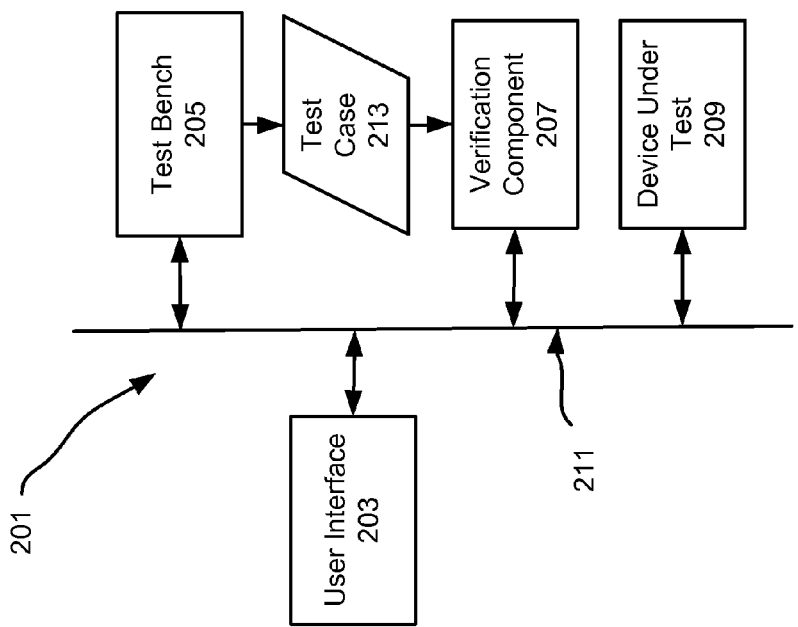
FIG. 2 shows a verification framework.

As stated above, electronic designs, often referred to as "hardware" for short, are verified during development to ensure that the hardware meets the intended goals of operations. FIG. 2 illustrates a verification framework 201, which may be employed to assist in the verification of a hardware design. As can be seen from this figure, the framework 201 includes a user interface 203, a test bench 205, a verification component 207 and a device under test 209. The components of the framework 201 are interconnected via a bus 211, which allows for communication between the various components. In various implementations, the framework 201 may be instantiated in a computing environment, such as, for example, the environment 101 of FIG. 1.

With some implementations, the user interface 203 is a command line interface allowing a user of the interface to control operation of the framework 201. With alternative implementations, the user interface 203 is a graphical interface, which may have the capability to display results of the verification in graphical format for the user as well as allow control of the verification framework 201 via a convenient menu system.

The test bench 205, which may be provided by the user, facilitates the generation of test cases 213. A test case, such as, for example, the test case 213, is a sequence of inputs to be applied to the device under test 209. In various implementations, the user may provide a number of specific test cases 213. In addition, the test bench 205 may generate a number of additional test cases 213, such as, for example by a constrained random technique.

Figure 3:
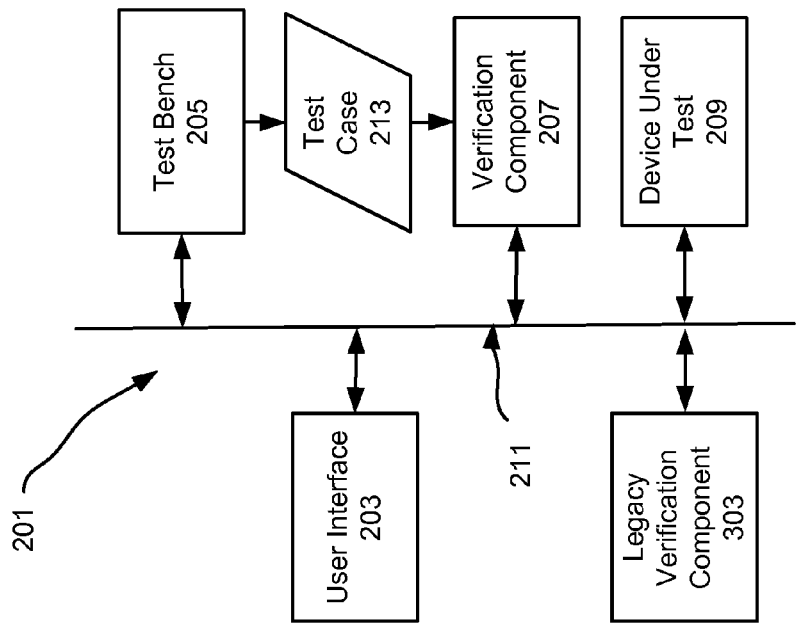
FIG. 3 shows a verification framework including a legacy verification component.

The verification component 207 provides a communication structure for applying the test cases 213 to the device under test 209. As stated above, in many cases a verification component 207 will be provided for various discreet portions of the device under test 209. However, as verification components are written in a specific hardware verification language, they are typically only compatible with verification frameworks also written in that hardware verification language. For example, FIG. 3 illustrates the verification framework 201 of FIG. 2. However, as can be seen a legacy verification component 303 is incorporated into the framework 201. In various implementations of the invention, the verification framework 201 follows an OVM. Correspondingly, the verification component 207 is an open verification component (OVC), such as, for example a SystemVerilog OVC, while the legacy verification component 303 is an e verification component (eVC). As mentioned above, and as those of skill in the art can appreciate, multiple verification components 207 are typically provided for each design. Additionally, multiple legacy verification components 303 may also be provided. Although the figures herein show a single verification component 207 and a single legacy verification component 303, the methods described herein are applicable to designs involving multiple components of each.

As further indicated above, conventional verification components (i.e. legacy verification components) are proprietary in nature. As modern verification frameworks have adopted an "open verification methodology," these legacy verification components are incompatible with modern verification frameworks. This can pose a significant problem when designers seek to verify designs which reuse thousands of components and as a result reuse thousands of legacy verification components on a modern verification framework.

Coexistence of Legacy Verification Components with Open Verification Components

Figure 4:
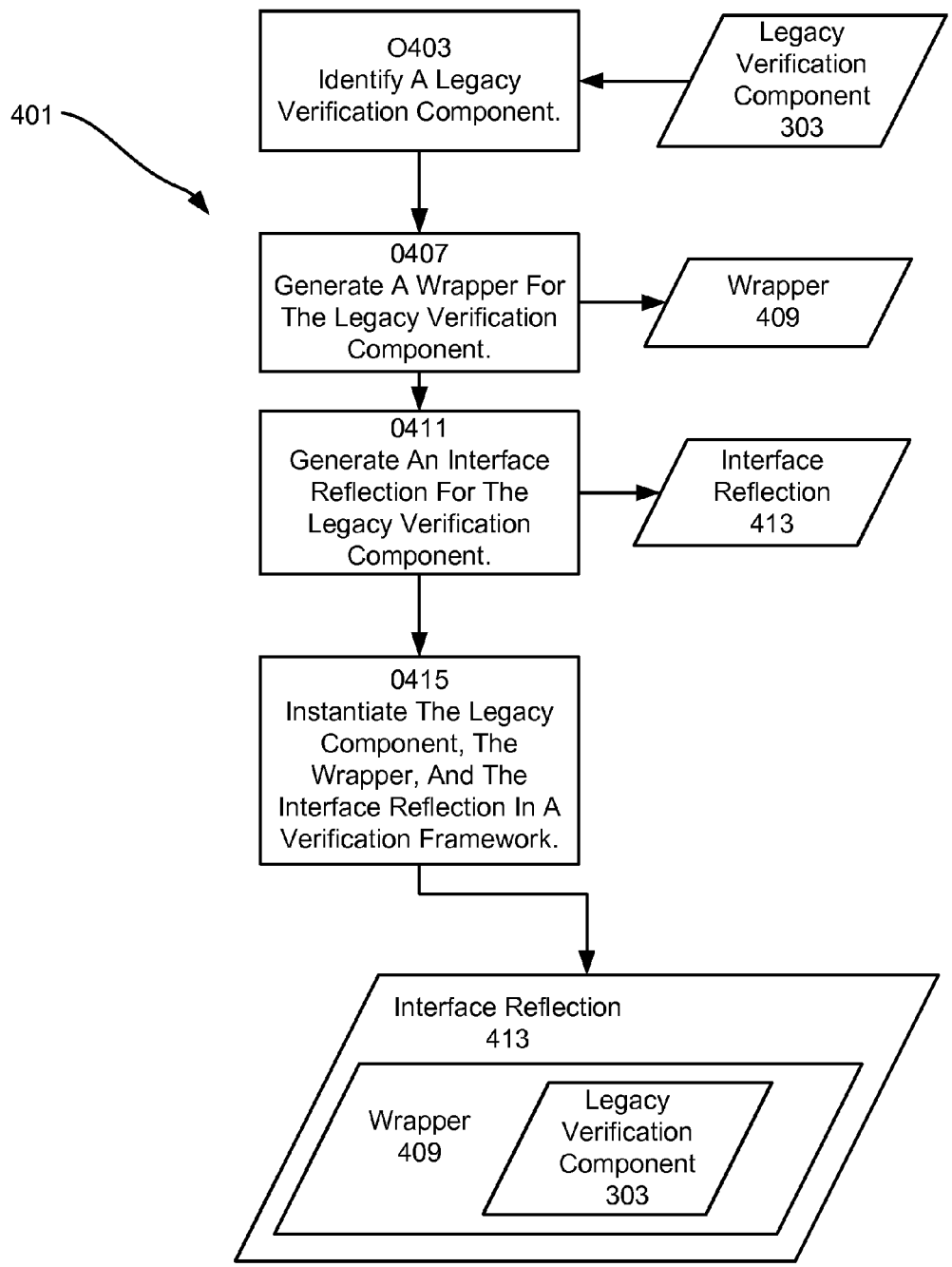
FIG. 4 shows a method of facilitating coexistence of multiple types of verification components in a verification framework.

FIG. 4 illustrates a method 401, which may be provided by various implementations of the invention to facilitate the coexistence of verification components. As can be seen from this figure, the method 401 includes an operation 403 for identifying a legacy verification component 303. Subsequently, the method 401 includes an operation 407 for generating a wrapper 409 for the legacy verification component 303 and an operation 411 for generating an interface reflection 413 for the legacy verification component 303. Lastly, the method 401 includes an operation 415 for instantiating the legacy verification component 303, wrapped in the wrapper 409, and the interface reflection 413 into a verification framework.

Figure 5:
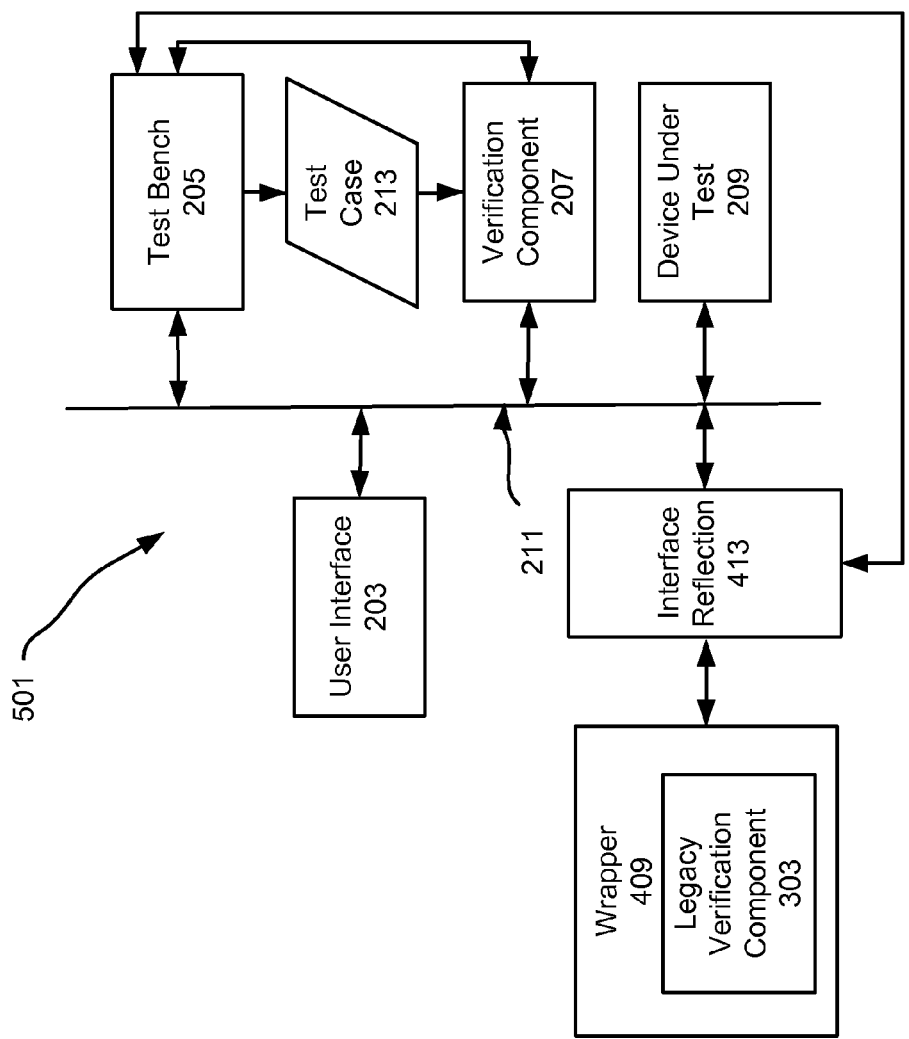
FIG. 5 shows a coexistence environment comprising a modified version of the verification framework of FIG. 2 and FIG. 3.

FIG. 5 shows the framework 201 illustrated in FIG. 3, however, the framework 201 has been modified by various implementations of the invention, such as, for example, the method 401, to provide for the coexistence of the verification components 213 and legacy verification component 303. As can be seen from this figure, the legacy verification component 303 has been wrapped in a wrapper 409, and an interface reflection 413 has been inserted between the framework 201 and the wrapper 503 and the legacy verification component 303.

As stated above, with some implementations of the invention, the legacy verification component 303 is an e verification component. In further implementations of the invention, the wrapper 409 is an "AOP" extension of the eVC. Still further, various functionality may be added by the wrapper 409, such as, for example open verification methodology path binding and configuration setting.

With some implementations of the invention, the reflected interface 413 may be used by the test bench 205 to translate and transfer data between the legacy verification component 303 and the framework 201. In addition to providing for data exchange between the framework and the legacy verification component 303, the interface reflection 413 may allow for later substitution of the legacy verification component 303 with a verification component 207. More particularly, the interface reflection may provide for the substitution of a compatible verification component with minimal changes to the verification framework 201.

Generating a Wrapper for the Legacy Verification Component

Returning to FIG. 4, as illustrated, the method 401 includes the operation 407 for generating the wrapper 409 for the legacy verification component 303. In various implementations of the invention, the operation 409 generates an open framework method to correspond to each of the methods defined by the legacy verification component 303. As those of skill in the art can appreciate, legacy verification components are typically connected to one or more wires, or a bus of wires. Furthermore, the legacy verification component may either drive these wires or monitor these wires, or some combination of both. Additionally, a number of methods or functions are typically defined to alert the framework when an action occurs with respect to one of the wires. For example, a "transfer_complete( )" method may be included in a legacy verification component that monitors a bus to identify the transfer of data, such as, in the case of the XBUS eVC (the XBUS eVC is commonly referenced by those of skill in the art and is frequently referred to when describing the functionality of the e verification language.)

With some implementations, the operation 409 generates configuration options to be included in the wrapper 409 for the purpose of configuring the settings of various parameters of the legacy verification component 303. With further implementations, the configuration option includes not only the ability to configure the parameter settings, but also includes a signal map for connecting wires in the framework 201 to the legacy verification component 303.

Generating a Reflection Interface

As described above, the interface reflection 413 is generated and when instantiated in a verification framework 201, allows for the transfer of signals and data between the legacy verification component 303 and the verification framework 201. In various implementations, the interface reflection 413 is configured to pass data through traditional communication techniques, such as, for example the PL/1 communication technique. In alternative implementations, data may be passed through more modern techniques, such as, for example, by utilization of the direct programming interface (DPI) capability of open verification methodologies, like SystemVerilog and through a bridge between the DPI layer and the legacy verification component 303.

In various implementations, for each data type defined by the legacy verification component 303, such as, for example a 'struct', there is a complementary representation generated, for example in C code. The complementary representation may contain many miscellaneous fields that are used to activate or "run" the legacy verification component 303 in addition to fields that are used to store the data that is passed back and forth between the verification framework 201 and the legacy verification component 303.

Instantiating the Legacy Verification Component, Wrapper, and Interface Reflection in a Verification Framework As stated above, the wrapper 409 and the interface reflection 413 include functionality to "configure" the legacy verification component 303 as these components are instantiated into the framework 201 by the operation 415. In various implementations, the normal parameters of the legacy verification components 303 are configured. One example of configuring a normal parameter is setting the name of the signal within the hardware design, which the legacy verification component 303 should connect to. In addition to configuring normal parameters, the operation 415 may also configure the connection between the components and the framework. One example of this is binding certain instances together so that function calls across the boundary between the legacy verification component 303 and the verification framework 201 are serviced in the correct order.

Ideally, all configuration for a coexistence environment, such as the verification framework 201 illustrated in FIG. 5, are concentrated in one single file. For example, in the following example, it would be quite confusing and error prone if the XBus configuration (number of slaves and masters, address ranges of slaves and so on) would have to be defined twice. More particularly, if the configuration were to be defined once for the e side and once for the SystemVerilog side.

Figure 6:
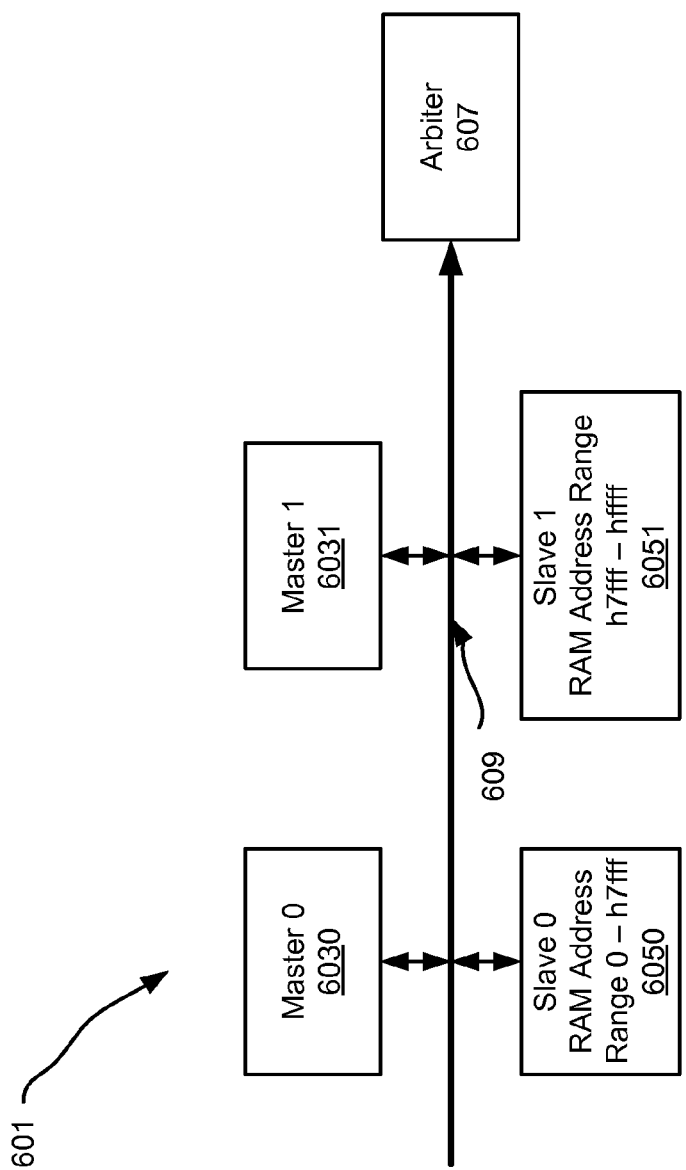
FIG. 6 shows a sample legacy verification component configuration.

Illustrative Example of an Application of Various Implementations of the Invention FIG. 6 illustrates an XBus configuration 601. As can seen from this figure, the XBus configuration 601 includes two active masters 603, two active slaves 605, an arbiter 607, and a bus 609. Assuming that the configuration 601 is provided as a legacy verification component 303, we may apply implementations of the invention to allow for verification of the configuration 601 in a coexistence environment. The following example makes heavy use of the various elements of the SystemVerilog programming language, assumed that the coexistence is taking place in a SystemVerilog framework (hereafter sometimes referred dot as the OVM testbench) and also assumes that the legacy verification component is provided in the e hardware verification language. The reader is advised to consult a representative text, such as, for example, *SystemVerilog for Verification A Guide to Learning the Testbench Language Features*, Second Edition, Springer Science, 2008, which book is incorporated entirely herein by reference.

Taking the XBus configuration 601, for each eVC instance (in this case there is one bus 609 and therefore one instance) a derivative of ovm_threaded_component instantiated in the OVM testbench. This derivative is called vr_xbus_env_u just like the top level of the eVC and has a configuration field called "has_coverage" that matches the eVC's top level "has_coverage" field. In addition, we have a derivative of ovm_threaded_compnent called vr_xbus_agent_u instantiated by the vr_xbus_env_u component for every agent that is instantiated by the eVC. The component vr_xbus_agent_u has an analysis port that is connected to the transaction_complete method port of the eVC agent, as well as a configuration field for each of the eVC agent's own configuration fields.

Working in this way has two important advantages. The first is that it makes all the eVCs used inside an environment visible and accessible from within the OVM world. It makes it possible to configure and connect to the eVCs in exactly the same way as we configure and connect to regular OVCs. The user can also see all the eVCs in the system by looking at the OVM component hierarchy.

The second advantage is that once the existing eVCs are converted to OVM, replacing those eVCs within existing testbenches will be much less painful as only small changes, if any, will be required to be made to the OVM.

Figure 7:
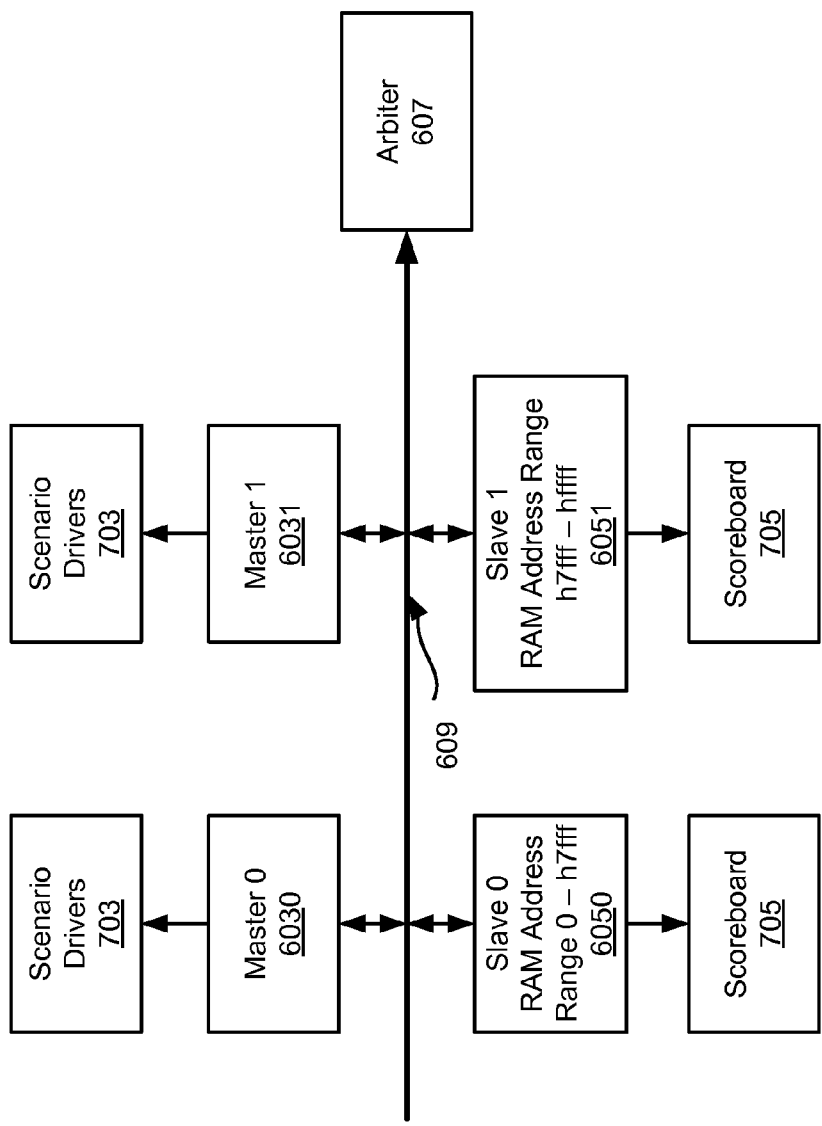
FIG. 7 shows the sample verification component of FIG. 6, modified to fit an open verification framework architecture.

FIG. 7 illustrates the architecture of the configuration 601 once OVM components are added and illustrates how the configuration of the eVC, including signal mapping may be done entirely from the OM test tile. As can be seen from this figure, the configuration 601 is present. Additionally, OVM components (i.e. the scenario drivers 703 and the scoreboards 705) are provided.

Integrating the eVC: Inventorying the eVC and Creating the eVC Extension

In order to integrate the eVC, it must be examined to determine the interface that is desired. This usually involves identifying the events, ports and configurations that are available. In order to integrate the eVC with SystemVerilog, the eVC is extended, and an 'e' layer is added to facilitate integration by the following script:

```
extend vr_xbus_agent_u {
    vr_xbus_agent_u_cfg : vr_xbus_agent_u_config;
    ovm_connection : ovm_connection;
    keep kind    == read_only(vr_xbus_agent_u_cfg.kind);
    keep agent_name   ==
    read_only(vr_xbus_agent_u_cfg.agent_name);
    keep active_passive ==
    read_only(vr_xbus_agent_u_cfg.active_passive);
    keep ovm_connection.ovm_component_path
               == read_only(
                   vr_xbus_agent_u_cfg.ovm_component_path);
    !last_resp_id : uint;
    transfer_complete : in method_port
               of vr_xbus_transfer_complete is instance;
    keep bind(agent_monitor.transfer_complete, transfer_complete);
    transfer_complete_c(ovm_component_path : string,
            transfer        : vr_xbus_trans_s,
            id              : int)
       is foreign dynamic C routine bridge:transfer_complete_c;
    transfer_complete(transfer: MONITOR vr_xbus_trans_s) is {
      transfer_complete_c(ovm_connection.ovm_component_path,
      transfer,
         t_resp_id);
    };
};
```

The agent_monitor has a function named transfer_complete( ) which is called on the 'e' side when the monitor has collected a transaction. This function is bound to transfer_complete( ) by the following script, which is defined as transfer_complete_c( ) and which is also a foreign dynamic routine:

```
void transfer_complete_c(
            SN_TYPE(string)    ovm_component_path,
            SN_TYPE(vr_xbus_trans_s) tr,
            SN_TYPE(uint)    id)
{
    int i;
    svScope scope;
    sv_vr_xbus_trans_s sv_trans;
    sv_trans.addr           = tr->addr;
    sv_trans.read_write     = tr->read_write;
    sv_trans.size           = tr->size;
    for (i=0; i<SN_LIST_SIZE(tr->data);i++) {
         sv_trans.data[i] = SN_LIST_GET(tr->data, i, int);
    };
```

```
// Get the "interface" we are bound to.
scope =
svGetScopeFromName("xbus_tb_top.vr_xbus_agent_u_if_i");
svSetScope(scope);
// The sv functions that are connected to the e method
// port have identical name
transfer_complete(ovm_component_path, &sv_trans, id);
}
```

The following script may be user to generate a SystemVerilog interface for the "e agent:"

```
interface vr_xbus_agent_u_if;
    import vr_xbus_pkg::*;
    export "DPI-C" function get_next_item;
    export "DPI-C" function transfer_complete;
        vr_xbus_agent_u ovm_components[$];
        function void register(vr_xbus_agent_u vr_xbus_agent);
            ovm_components[$+1] = vr_xbus_agent;
        endfunction // set_evc_wrapper
function void get_next_item(string ovm_component_path, output
                    sv_vr_xbus_trans_s tr, output int unsigned id);
        foreach(ovm_components[i])
            if(ovm_components[i].m_name ==
                ovm_component_path)
                    ovm_components[i].get_next_item(tr, id);
    endfunction
    function void transfer_complete(string ovm_component_path, input
                    sv_vr_xbus_trans_s tr, input int unsigned id);
        foreach(ovm_components[i])
            if(ovm_components[i].m_name ==
                ovm_component_path)
                    ovm_components[i].transfer_complete(tr, id);
    endfunction
endinterface
```

The following is a SystemVerilog class definition for the "e agent:"

```
class vr_xbus_agent_u extends e_unit_wrapper_base;
    ...
    function void transfer_complete(
        input sv_vr_xbus_trans_s vr_tr,
        input int unsigned id);
        vr_xbus_transfer tr;
        tr = new( );
        tr.to_class(vr_tr);
        // used for requests that require responses
        scenario_controller.last_resp_id = id;
        transfer_complete_ap.write(tr);
    endfunction
endclass
```

The following script may be used to configure the agent:

```
typedef struct {
    string                              ovm_component_path;
    vr_xbus_agent_kind_t                kind;
    vr_xbus_agent_name_t                agent_name;
    erm_active_passive_t                active_passive;
    vr_xbus_slave_config_u_config_struct config_;
} vr_xbus_agent_u_config_struct;
```

Creating the Bridge Between e and SystemVerilog

The bridge, referred to above as the interface reflector, between e and SystemVerilog needs to pass data and control. The DPI interface between e and SystemVerilog is responsible for formatting the data. For each datatype defined (an 'e' struct) there is a C representation which is generated. Check in the example code in tridge.h' for such definitions. The generated C struct (generated from 'e') contains many miscellaneous fields which are only needed to run the 'e' engine, and are not part of the data passed back and forth from e to SystemVerilog.

The DPI bridge between e and SystemVerilog normalizes the 'e' structures into "transactions" or data transfer. The DPI bridge is really just a copy operation—copying from e to SystemVerilog or from SystemVerilog to e. This is the normal DPI functionality. Calling 'e' functions requires a SystemVerilog import definition. Calling SystemVerilog functions from 'e' requires a SystemVerilog export definition, then it requires defining the 'e' foreign dynamic C routine, along with the DPI function call which implements the data transfer. This is illustrated in the following script:

```
typedef struct{
    int                 addr;
    vr_xbus_read_write_t read_write ;
    int unsigned        size ;
    int                 data[8];
} sv_vr_xbus_trans_s;
class vr_xbus_transfer extends ovm_object;
    rand bit [15:0]         addr;
    rand vr_xbus_read_write_t read_write;
    rand int unsigned       size;
    rand bit [7:0]          data[ ];
    rand int unsigned       wait_state[ ];
    rand int unsigned       error_pos;
    rand int unsigned       transmit_delay = 0;
    string                  master = "";
    string                  slave = "";
    // Constraints
    ...
    // Field automation
    ...
    // new - constructor
    function new (string name ="");
    ...
    endfunction : new
    function void to_class(sv_vr_xbus_trans_s vr_tr);
        this.addr = vr_tr.addr;
        this.read_write = vr_tr.read_write;
        this.size = vr_tr.size;
```

-continued

```
            this.data = new[vr_tr.size];
            foreach(vr_tr.data[i]) this.data[i] = vr_tr.data[i];
        endfunction // vr_xbus_transfer
        function sv_vr_xbus_trans_s to_struct( );
            to_struct.addr = addr;
            to_struct.read_write = read_write;
            to_struct.size = size;
            foreach(data[i]) to_struct.data[i] = data[i];
        endfunction
        ...
endclass // vr_xbus_transfer
From vr_xbus_trans_h.e:
struct vr_xbus_trans_s like any_sequence_item {
        kind : vr_xbus_trans_kind_t;
            keep soft kind == GENERIC;
        -- This field contains the address for the transfer.
        %addr : vr_xbus_addr_t;
        -- This field indicates whether this is a a read or write transfer.
        %read_write : vr_xbus_read_write_t;
            keep read_write in [READ, WRITE];
        -- This field indicates the size of the transfer in bytes.
        size : uint [1, 2, 4, 8];
        -- This field contains the data to be transferred as a list of bytes, the
        -- size of the list depends on the size field.
        %data[size] : list of byte;
        -- This method returns the transfer in a "nice" string form that gives a
        ...
}; -- struct vr_xbus_trans_s
typedef struct s___vr_xbus___vr_xbus_trans_s {
        t___int d___;
        t___int gen___;
            struct s___e_core___any_unit *root___unit;
            struct s___e_core___any_sequence *parent_sequence;
            t___int evc_util_sequence____depth_from_driver;
            struct s___main___sn_stripe_info *stripe_info;
            t___int sn____quit_occ_l;
            struct s___main___sn_event_struct *sn____quit_event_struct;
            t___vr_xbus___vr_xbus_trans_kind_t kind;
            t___vr_xbus___vr_xbus_addr_t addr;
            t___vr_xbus___vr_xbus_read_write_t read_write;
            t___vr_xbus___vr_xbus_trans_s___size size;
            struct s___l___byte *data;
            struct s___l___uint *MONITOR___waits;
            t___uint MONITOR___error_pos_mon;
            t___vr_xbus___vr_xbus_bus_name_t MASTER___bus_name;
            t___vr_xbus___vr_xbus_agent_name_t MASTER___master_name;
            t___bool MASTER___check_error;
            t___int MASTER___error_pos_master;
            t___uint MASTER___transmit_delay;
            struct s___vr_xbus___vr_xbus_master77491 *MASTER___driver;
} *t___vr_xbus___vr_xbus_trans_s;
// C functions are named like corresponding method ports with _c suffix
void transfer_complete_c(
        SN_TYPE(string)        ovm_component_path,
            SN_TYPE(vr_xbus_trans_s) tr,
            SN_TYPE(uint)          id) {
    int i;
    svScope scope;
    sv_vr_xbus_trans_s sv_trans;
    sv_trans.addr       = tr->addr;
    sv_trans.read_write = tr->read_write;
    sv_trans.size       = tr->size;
    for (i=0; i<SN_LIST_SIZE(tr->data);i++) {
        sv_trans.data[i] = SN_LIST_GET(tr->data, i, int);
    };
    // Get the "interface" we are bound to.
    scope = svGetScopeFromName("xbus_tb_top.vr_xbus_agent_u_if_i");
    svSetScope(scope);
    // The sv functions that are connected to the e method port have identical name
    transfer_complete(ovm_component_path, &sv_trans, id);
}
SN_TYPE(vr_xbus_trans_s)              get_next_item_c(SN_TYPE(string)
ovm_component_path, SN_TYPE(uint)* id) {
    svScope scope;
    sv_vr_xbus_trans_s sv_trans;
    scope = svGetScopeFromName("xbus_tb_top.vr_xbus_agent_u_if_i");
    svSetScope(scope);
    get_next_item(ovm_component_path, &sv_trans, id);
    SN_TYPE(vr_xbus_trans_s) tr = SN_STRUCT_NEW(vr_xbus_trans_s);
```

```
// Since we are passing structs between c and SV there
// is no way of passing null back. Information about
// transaction validity should be passed inside the transaction
// also we can't pass null back to Specman because of a Specman bug.
// so, pass NOP back
tr->read_write = sv_trans.read_write;
tr->addr = sv_trans.addr;
tr->size = sv_trans.size;
int i;
// problem with using fixed arrays on the SV side is that
// we should always get a size data seperately with them
//for (i=0; i<sizeof(sv_trans.data)/sizeof(sv_trans.data[0]);i++) {
for (i=0; i<tr->size;i++) {
    SN_LIST_ADD(tr->data, sv_trans.data[i]);
};
return tr;
};
```

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A method comprising:
    identifying, by a computing system, one or more functions of a verification component written in a first hardware description language;
    generating, by a computing system, a wrapper that defines one or more functions capable of implementation in the verification framework written in a second hardware description language that correspond to the identified functions of the verification component; and
    generating, by a computing system, an interface reflection configured to bridge communication between the verification component and the verification framework, wherein the verification component, based on the functions defined in the wrapper, is configured to interact with a circuit design in the verification framework via the interface reflection.

2. The method of claim 1, further comprising instantiating, by the computing system, the verification component, the wrapper, and the interface reflection in the verification framework.

3. The method of claim 1, wherein generating the wrapper further comprises:
    identifying a configuration defined in the first hardware description language for the verification component; and
    defining an open framework configuration option in the second hardware description language, which corresponds to the identified configuration.

4. The method of claim 3, further comprising configuring, by the computing system, the verification component in part through the open framework configuration option.

5. The method of claim 1, wherein generating the interface reflection further comprises:
    identifying at least one data-type defined by the verification component; and
    defining a complementary data-type that corresponds to each of the at least one identified data-types.

6. The method of claim 5, wherein the at least one complementary data-types include one or more activation fields.

7. The method of claim 1, wherein the first hardware description language is e and the second hardware description language is SystemVerilog.

8. An apparatus comprising at least one computer-readable memory device storing instructions configured to cause one or more processing devices to perform operations comprising:
    identifying one or more functions of a verification component written in a first hardware description language;
    generating a wrapper that defines one or more functions capable of implementation in the verification framework written in a second hardware description language that correspond to the identified functions of the verification component; and
    generating an interface reflection configured to bridge communication between the verification component and the verification framework, wherein the verification component, based on the functions defined in the wrapper, is configured to interact with a circuit design in the verification framework via the interface reflection.

9. The apparatus of claim 8, wherein the instructions are configured to cause one or more processing devices to perform operations further comprising instantiating the verification component, the wrapper, and the interface reflection in the verification framework.

10. The apparatus of claim 8, wherein generating the wrapper further comprises:
    identifying a configuration defined in the first hardware description language for the verification component; and
    defining an open framework configuration option in the second hardware description language, which corresponds to the identified configuration.

11. The apparatus of claim 10, wherein the instructions are configured to cause one or more processing devices to perform operations further comprising configuring the verification component in part through the open framework configuration option.

12. The apparatus of claim 8, wherein generating the interface reflection further comprises:
    identifying at least one data-type defined by the verification component; and
    defining a complementary data-type that corresponds to each of the at least one identified data-types.

13. The apparatus of claim 12, wherein the at least one complementary data-types include one or more activation fields.

14. The apparatus of claim 8, wherein the first hardware description language is e and the second hardware description language is SystemVerilog.

15. A system comprising:
a memory system storing instructions; and
a computing system including one or more processing devices that, in response to executing the instructions, are configured to perform operations comprising:
identifying one or more functions of a verification component written in a first hardware description language;
generating a wrapper that defines one or more functions capable of implementation in the verification framework written in a second hardware description language that correspond to the identified functions of the verification component; and
generating an interface reflection configured to bridge communication between the verification component and the verification framework, wherein the verification component, based on the functions defined in the wrapper, is configured to interact with a circuit design in the verification framework via the interface reflection.

16. The system of claim 15, wherein the one or more processing devices, in response to executing the instructions, are configured to perform operations further comprising instantiating the verification component, the wrapper, and the interface reflection in the verification framework.

17. The system of claim 15, wherein the one or more processing devices, in response to executing the instructions, are configured to generate the wrapper by identifying a configuration defined in the first hardware description language for the verification component, and defining an open framework configuration option in the second hardware description language, which corresponds to the identified configuration.

18. The system of claim 17, wherein the one or more processing devices, in response to executing the instructions, are configured to perform operations further comprising configuring the verification component in part through the open framework configuration option.

19. The system of claim 15, wherein the one or more processing devices, in response to executing the instructions, are configured to generate the interface reflection by identifying at least one data-type defined by the verification component, and defining a complementary data-type that corresponds to each of the at least one identified data-types.

20. The system of claim 19, wherein the at least one complementary data-types include one or more activation fields.

\* \* \* \* \*